(12) United States Patent
Tsang et al.

(10) Patent No.: US 7,932,600 B2
(45) Date of Patent: Apr. 26, 2011

(54) ELECTRICAL CONNECTING STRUCTURE AND BONDING STRUCTURE

(75) Inventors: Ngai Tsang, Tainan (TW); Kuo-Shu Kao, Hsinchu (TW)

(73) Assignees: Taiwan TFT LCD Association, Hsinchu (TW); Chunghwa Picture Tubes, Ltd., Taoyuan (TW); Au Optronics Corporation, Hsinchu (TW); Hannstar Display Corporation, Taipei County (TW); Chi Mei Optoelectronics Corporation, Tainan County (TW); Industrial Technology Research Institute, Hsinchu (TW); TPO Dispalys Corp., Miao-Li County (TW)

( * ) Notice: Subject to any disclaimer, the term of this patent is extended or adjusted under 35 U.S.C. 154(b) by 357 days.

(21) Appl. No.: 12/129,711

(22) Filed: May 30, 2008

(65) Prior Publication Data

US 2009/0200686 A1 Aug. 13, 2009

(30) Foreign Application Priority Data

Feb. 12, 2008 (TW) .............................. 97104832 A

(51) Int. Cl.
*H01L 23/48* (2006.01)
(52) U.S. Cl. . 257/737; 257/738; 257/784; 257/E23.021; 257/E23.069

(58) Field of Classification Search .................. 257/737, 257/738, 778, E23.021, E23.069, 784; 228/180.22; 438/612–617; 174/126.4
See application file for complete search history.

(56) References Cited

U.S. PATENT DOCUMENTS

| 4,740,700 A * | 4/1988 | Shaham et al. ............... 250/332 |
| 5,477,087 A | 12/1995 | Kawakita et al. |
| 7,170,187 B2 | 1/2007 | Bernier et al. |
| 7,221,053 B2 * | 5/2007 | Meyer et al. .................. 257/737 |
| 7,246,432 B2 | 7/2007 | Tanaka et al. |
| 7,759,240 B2 * | 7/2010 | Farnworth et al. ............ 438/614 |

FOREIGN PATENT DOCUMENTS

CN 1722421 1/2006

OTHER PUBLICATIONS

"Polymer Bump Flip Chip", Richard Estes, Jan. 2001.*
"First Office Action of China Counterpart Application", issued on May 10, 2010, p. 1-p. 3.

* cited by examiner

*Primary Examiner* — Jasmine J Clark
(74) *Attorney, Agent, or Firm* — Jianq Chyun IP Office

(57) ABSTRACT

An electrical connecting structure including a conductive pad, a polymer bump and a patterned conductive layer is provided. The conductive pad is on a substrate and the polymer bump is disposed over the substrate. The patterned conductive layer is disposed on the polymer bump and electrically connects to the conductive pad, wherein the patterned conductive layer covers a portion of the polymer bump and exposes another portion of the polymer bump.

19 Claims, 3 Drawing Sheets

ELECTRICAL CONNECTING STRUCTURE AND BONDING STRUCTURE

CROSS-REFERENCE TO RELATED APPLICATION

This application claims the priority benefit of Taiwan application serial no. 97104832, filed on Feb. 12, 2008. The entirety of the above-mentioned patent application is hereby incorporated by reference herein and made a part of specification.

BACKGROUND OF THE INVENTION

1. Field of the Invention

The present invention relates to an electrical connecting structure and a electronic device bonding structure, and particularly relates to a low stress connecting structure and a bonding structure which using this structure.

2. Description of Related Art

As technology advances, all kinds of electronic devices are developed to be miniaturized and multi-function. Hence, high density assemble methods were developed to increase electrical signal transition.

By conventional technique, anisotropic conductive film (ACF) is a popular connecting method using for electronic components connection such as semiconductor with the patterning electrodes of ITO glass. ACF is placed between semiconductor and ITO glass. And then, apply pressure and temperature on the semiconductor, ACF and glass. Semiconductor and ITO glass will be electrically connected by way of ACF which contain of conductive particles inside.

However, when the density of electrode of semiconductor and ITO glass continue increasing, gap between the electrodes will be decreased. As a consequence, ACF conductive particles may be gathered in space between two electrode, and cause short circuit or electric leakage.

Another assemble method was developed to solve this problem. Its electrode structure is made by polymer and surface is covered by metal. Non-Conductive film (NCF) or Non-conductive paste (NCP) is used for semiconductor device joining with device carrier. After applied pressure and temperature on semiconductor, the polymer electrodes which attached on semiconductor surface will be passing through non-conductive film and contact the electrode where on the device carrier. Electrical connection will be connecting by the metal layer where cover on the surface of polymer bump. Also, non-conductive film is epoxy base material which can provide permanent mechanical supporting to maintain the electrical connection. However, Young's module between polymer bump and metal cover layer has large difference. This will cause the problem of stress concentration on the metal layer, result in metal layer broken and affected its electrical reliability.

To solve the above problem, U.S. Pat. No. 7,170,187 provides a method, which adds metal particles into the polymer bump. Also, metal structures are added onto the surface of the polymer bump or inside the polymer bump, so that the bump both has electrical conductivity and elasticity property. However, to apply such a method, developing special metal particles is necessary. Furthermore, adding metal structures on the surface of the polymer bump or inside the polymer bump will lead to the process become more complicated.

In addition, U.S. Pat. No. 7,246,432 provides a method, in which the polymer bump is made of special polymer material. During curing, the special polymer will shrinking and form arc structure. Then, another polymer material layer and metal layer will cover on it sequentially. The disadvantage of this method is using curing process to build the arc structure is hard to control, bumping process also difficult and complicated.

SUMMARY OF THE INVENTION

The present invention provides an electrical connecting structure, which is used to solve the problem that stress concentration occurring in a conventional polymer bump bonding process and cause metal layer broken.

The present invention provides a bonding structure, which uses a special electrical connecting structure design to reduce the risk of broken on metal layer during bonding process.

The present invention provides an electrical connecting structure, which comprises a conductive pad, a polymer bump, and a patterned conductive layer. The conductive pad and polymer bump are both disposed on the substrate. The patterned conductive layer is covered on the polymer bump and electrically connected with the conductive pad, wherein the patterned conductive layer covers a portion of the polymer bump and exposes another portion of the polymer bump.

The present invention further provides a bonding structure, which comprises a first substrate, a second substrate, and a bonding layer. As least an electrical connecting structure is disposed on the first substrate, wherein the electrical connecting structure comprises a conductive pad, a polymer bump, and a patterned conductive layer. The patterned conductive layer is disposed on the polymer bump and electrically connected with the conductive pad. Further, the patterned conductive layer covers a portion of the polymer bump and exposes another portion of the polymer bump. Moreover, as least a conductive structure is disposed on the second substrate. The bonding layer is disposed between the first substrate and the second substrate, wherein the polymer bump and the patterned conductive layer on the first substrate pass through the bonding layer and electrically connect with the conductive structure which on the second substrate.

According to the present invention, the polymer bump is covered by the patterned conductive layer. Because the polymer bump is not fully covered by the conductive layer, stress concentration which occurs in the bonding process is decreased and also the breaking risk of the conductive layer on the polymer bump will be reduced.

To make the above features and advantages of the present invention more comprehensible, several embodiments accompanied with figures are described in detail as follows.

DESCRIPTION OF EMBODIMENTS

Figure 1A:
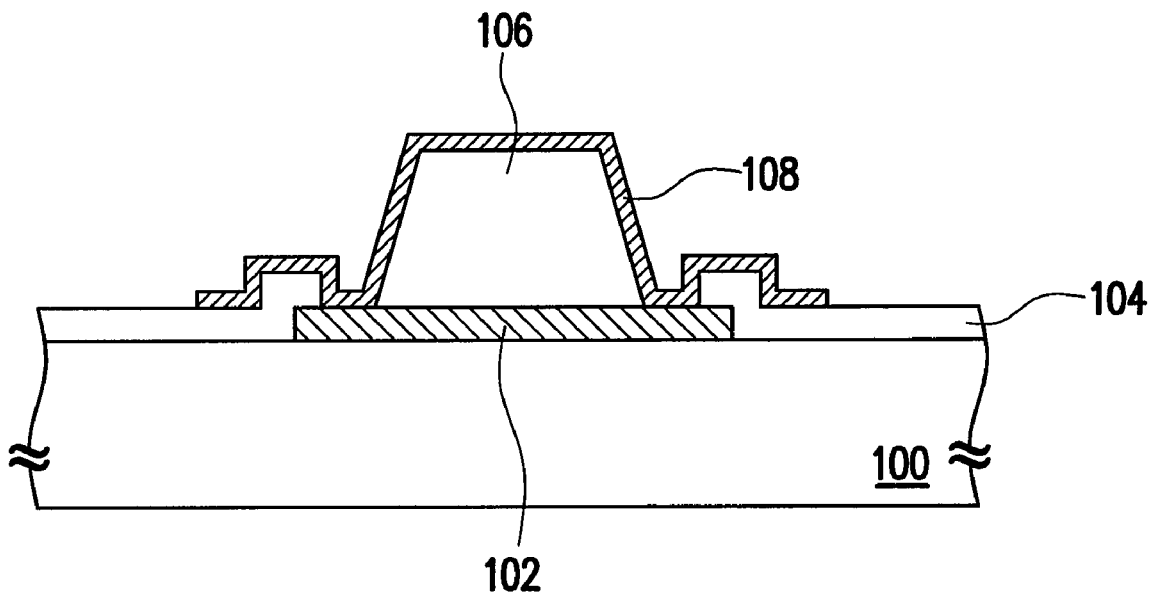
FIG. 1A is a lateral cross-sectional view of an electrical connecting structure according to an embodiment of the present invention.
Figure 1B:
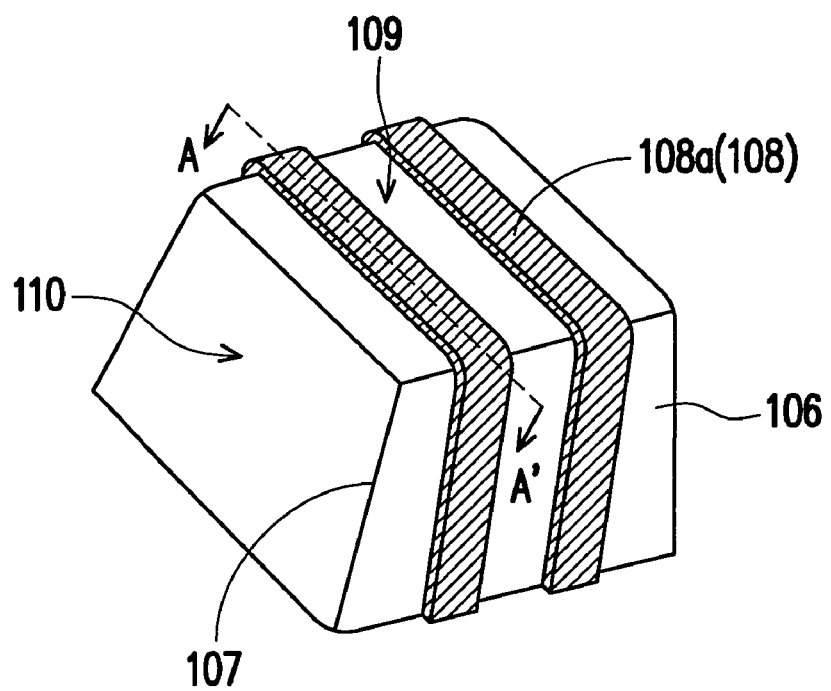
FIG. 1B is a solid schematic diagram of a polymer bump and a patterned conductive layer which shown in FIG. 1A.

FIG. 1A is a lateral cross-sectional view showing an electrical connecting structure according to an embodiment of the present invention, and FIG. 1B is a solid schematic diagram illustrating a polymer bump and a patterned conductive layer of the electrical connecting structure shown in FIG. 1A. The cross-sectional view of FIG. 1A corresponds to cross-sectional line A-A' in FIG. 1B. Referring to FIG. 1A and FIG. 1B, the electrical connecting structure in this embodiment comprises a conductive pad 102, a polymer bump 106, and a patterned conductive layer 108.

The conductive pad 102 is disposed on a substrate 100. In a preferred embodiment, the substrate 100 further comprises a protective layer 104 covering thereon and exposing the conductive pad 102. The substrate 100 is, for example, a glass substrate, a silicon substrate, a plastic substrate, or a metal substrate. The conductive pad 102 is, for example, a metal conductive pad which is electrically connected with elements (not shown) formed on the substrate 100. A method for forming the conductive pad 102 is, for example, depositing a metal layer on the substrate 100 through a deposition process and then patterning the metal layer to form the conductive pad 102 through photolithography and etching processes. A material of the protective layer 104 is, for example, silicon nitride. A method for forming the protective layer 104 is, for example, forming a layer of protective material through a deposition process and then patterning the protective material to expose the conductive pad 102 through photolithography and etching processes.

The polymer bump 106 is disposed on the substrate 100. In this embodiment, the polymer bump 106 is formed on the conductive pad 102. The polymer bump 106 may be a polygonal column structure or a polygonal taper structure. If the polymer bump 106 is a polygonal column structure, a top area of the polymer bump 106 is equal to a bottom area thereof. If the polymer bump 106 is a polygonal taper structure, a top area of the polymer bump 106 is smaller than a bottom area thereof. The polymer bump 106 illustrated in the figures of this embodiment is a quadrilateral taper structure. However, the present invention is not limited thereto. The polymer bump 106 may be a pentagonal, hexagonal, or other polygonal column structure or taper structure. Moreover, a material of the polymer bump 106 may be a single-polymer material or a mixture of a plurality of polymers. In addition, the polymer bump 106 may be a single-layer structure or a multi-layer structure. A single-layer structure is illustrated in the figures of this embodiment. However, the present invention is not limited thereto. The polymer bump 106 may be a two-layer, three-layer, or multi-layer structure. A method for forming the polymer bump 106 is, for example, coating a polymer material layer through a coating process and then patterning the polymer material layer through a photolithography process or through photography and etching processes.

The patterned conductive layer 108 is disposed on the polymer bump 106 and electrically connected with the conductive pad 102. Particularly, the patterned conductive layer 108 covers a portion of the polymer bump 106 and expose another portion of the polymer bump 106. In other words, the patterned conductive layer 108 does not fully cover the polymer bump 106 but exposes some areas of the polymer bump 106. A material of the patterned conductive layer 108 is, for example, a metal which may comprise a single conductive or metal material or comprise a mixture of a plurality of conductive or metal materials. In addition, the patterned conductive layer 108 may be a single-layer structure or a multi-layer structure. A single-layer structure is illustrated in the figures of this embodiment. However, the present invention is not limited thereto. The patterned conductive layer 108 may be a two-layer, three-layer, or multi-layer structure. Moreover, a method for forming the patterned conductive layer 108 is, for example, forming a layer or layers of conductive material through a deposition process and then patterning the conductive material to form the conductive layer 108 with a specific pattern through photolithography and etching processes.

In an embodiment, referring to FIG. 1B, the polymer bump 106 comprises an upper surface 109 and a plurality of side surfaces 110, and a corner edge 107 is between neighboring side surfaces 110. The conductive layer 108 exposes the corner edges 107 between neighboring side surfaces 110. In the embodiment shown in FIG. 1B, the patterned conductive layer 108 comprises at least a strip pattern 108a, which extends from one side surface 110 of the polymer bump 106 to opposite side surface 110 through the upper surface 109. Two strip patterns 108a parallel with each other are illustrated in this embodiment. However, the present invention does not limit the number of the strip patterns nor limit the strip patterns to extend from which side surface to opposite side surface. As long as the strip patterns expose the polymer bump 106, and particularly expose the corner edges 107 of the polymer bump 106, the purpose of the present invention is achieved.

Figure 2:
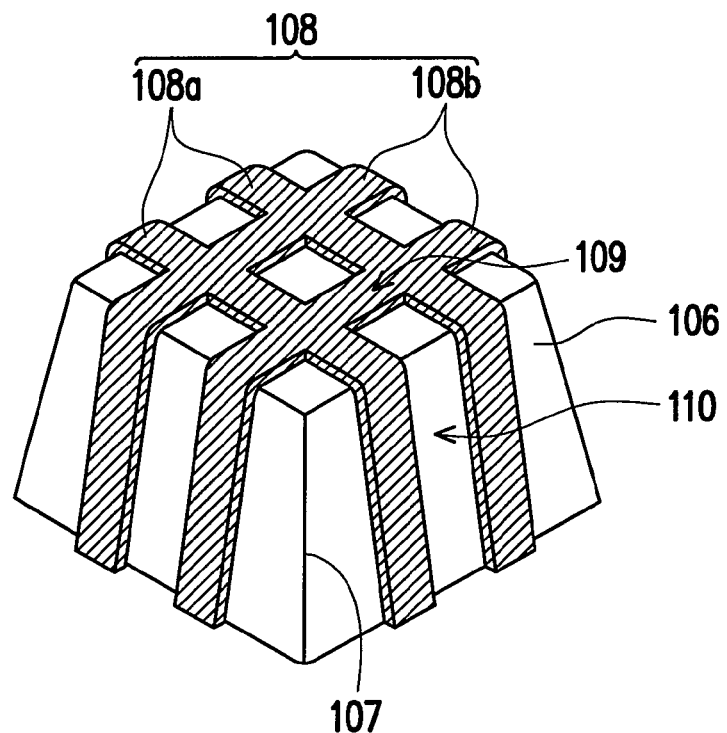
FIG. 2 is a solid schematic diagram of a polymer bump and a patterned conductive layer according to another embodiment of the present invention.

The patterned conductive layer 108 illustrated in FIG. 1B may also have other kinds of patterns. Referring to FIG. 2, the patterned conductive layer 108 comprises at least a first strip pattern 108a and at least a second strip pattern 108b. The first strip pattern 108a and the second strip pattern 108b respectively extend from two side surfaces 110 of the polymer bump 106 to opposite two side surfaces 110 through the upper surface 109. Further, the first strip pattern 108a and the second strip pattern 108b intersect on the upper surface 109. The embodiment shown in FIG. 2 illustrates that the first strip pattern 108a and the second strip pattern 108b are arranged in parallel. However, the present invention does not limit the number of the strip patterns. As long as the strip patterns expose the polymer bump 106, and particularly expose the corner edges 107 of the polymer bump 106, the purpose of the present invention is achieved.

Figure 3:
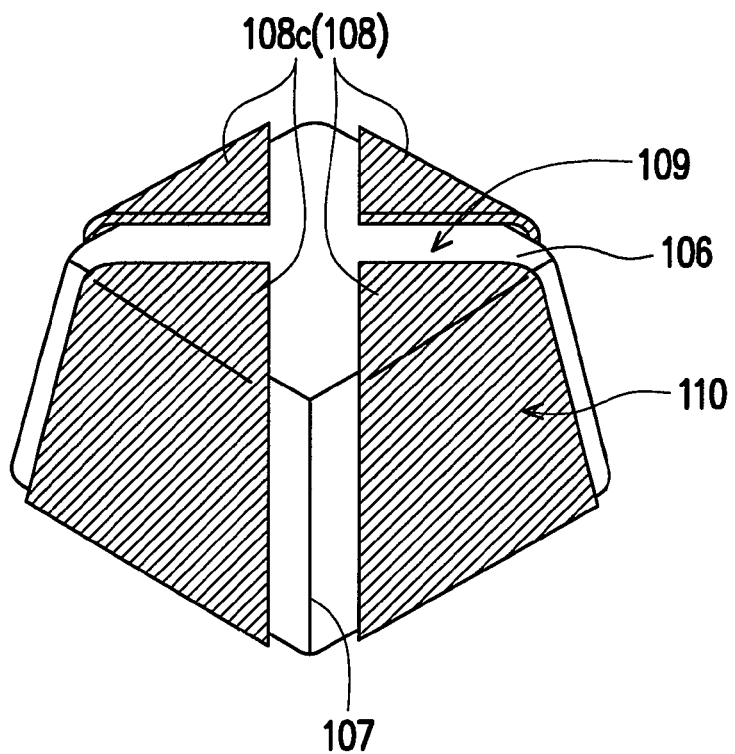
FIG. 3 is a solid schematic diagram of a polymer bump and a patterned conductive layer according to another embodiment of the present invention.

The patterned conductive layer 108 may also have a design as shown in FIG. 3. Referring to FIG. 3, the patterned conductive layer 108 comprises a plurality of block patterns 108c. Each block pattern 108c covers one of the side surfaces 110 and extends to the upper surface 109, and exposes the corner edge 107. In the embodiment as shown in FIG. 3, the block patterns 108c cover a large portion of the side surfaces 110 and expose the areas near the corner edges 107. Further, the block patterns 108c extend to the upper surface 109 and form a cross trench pattern on the upper surface 109.

Figure 4:
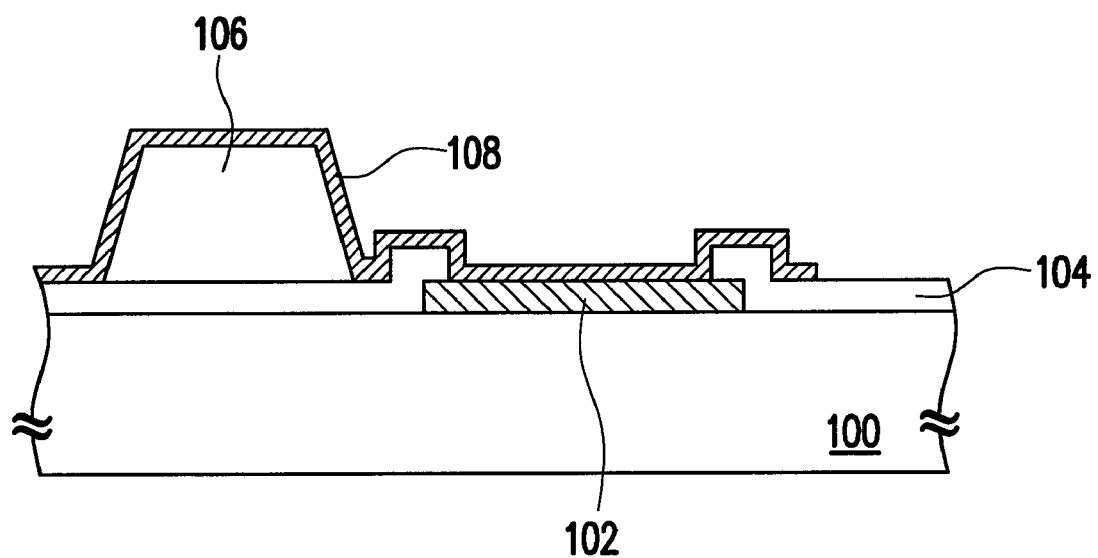
FIG. 4 is a lateral cross-sectional view of an electrical connecting structure according to another embodiment of the present invention.

Moreover, in the embodiment as shown in FIG. 1A, the polymer bump 106 is disposed on the conductive pad 102. However, the present invention is not limited thereto. In fact, the polymer bump of the present invention may also be disposed on the substrate without covering the conductive pad. As shown in FIG. 4, the polymer bump 106 is disposed on the substrate 100 or on the protective layer 104 where without covering the conductive pad 102. The patterned conductive layer 108 covers a portion of the polymer bump 106 and extend to the conductive pad 102 to achieve electrical connection. Particularly, the patterned conductive layer 108 may also be the patterns as shown in FIG. 1B, FIG. 2, and FIG. 3.

In the present invention, because the conductive layer covering the polymer bump is patterned, the conductive layer does not fully cover the polymer bump. Particularly, the patterned conductive layer exposes the corner edges of the polymer bump. The aforesaid design decreases stress concentration which occurs during the bonding, so as to reduce the breaking risk of the conductive layer on the polymer bump. A bonding process and a bonding structure of the aforesaid electrical connecting structure are detailed as follows.

Figure 5:
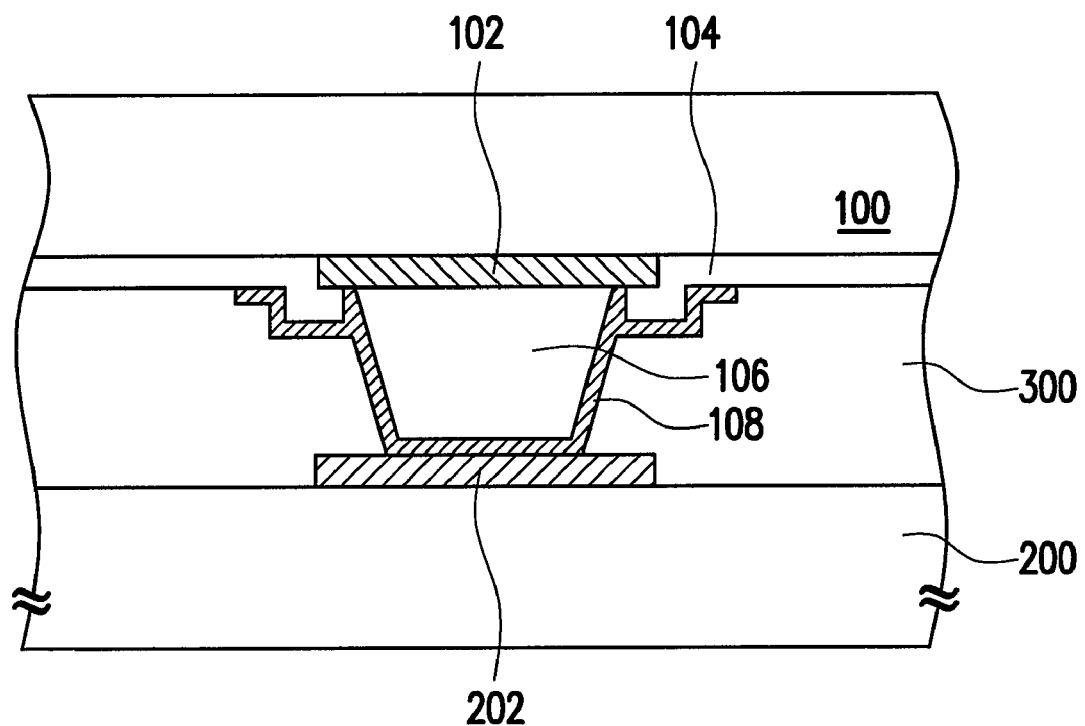
FIG. 5 is a lateral cross-sectional view of a bonding structure according to an embodiment of the present invention.

Referring to FIG. 5, a first substrate 100 is first provided, on which at least an electrical connecting structure is disposed. The electrical connecting structure comprises a conductive pad 102, a polymer bump 106, and a patterned conductive layer 108. The patterned conductive layer 108 is disposed on the polymer bump 106 and electrically connected with the conductive pad 102. Particularly, the patterned conductive layer 108 covers a portion of the polymer bump 106 and exposes another portion of the polymer bump 106. The electrical connecting structure on the first substrate 100 may be any electrical connecting structure shown in FIGS. 1A-1B, FIG. 2, FIG. 3, and FIG. 4.

In addition, a second substrate 200 is provided, on which at least a conductive structure 202 is disposed. Then, a adhesion layer 300 is disposed between the first substrate 100 and the second substrate 200. The adhesion layer is, for example, a anisotropic conductive film (ACF), a anisotropic conductive paste (ACP), a non-conductive adhesive paste or a non-conductive adhesive film. In an embodiment, the adhesion layer 300 can be pure thermosetting material or comprises filling particles distributed therein. The particle can be electrically insulating or electrically conductive.

Next, a bonding process is preformed to compress the first substrate 100, the adhesion layer 300, and the second substrate 200, so that the polymer bump 106 and the patterned conductive layer 108 on the first substrate 100 pass through the bonding layer 300 and electrically connect with the conductive structure 202 on the second substrate 200.

It is noted that the conductive layer 108 of the electrical connecting structure on the first substrate 100 does not fully covers the polymer bump 106. Particularly, the conductive layer 108 exposes the corner edges of the polymer bump 106. In a conventional bonding structure, stress concentration easily occurs around the corner edges of the polymer bump and results in the breaking of the conductive layer. The result may be electrically disconnects between the conductive layer and the conductive pad and cause the bonding structure can not be electrically coupled. Hence, the present invention patterns the conductive layer to decrease stress concentration occurring in bonding process so as to reduce the breaking risk of the conductive layer.

In addition, the present invention uses common photolithography and etching processes to pattern the conductive layer. In fact, to achieve the patterning conductive layer just only edit the photomask pattern of metal layer. Additional fabricating processes or materials are not required.

While the invention has been described in terms of preferred embodiments, those skilled in the art will recognize that invention can be practiced with modification within the spirit and scope of the appended claims.

What is claimed is:
1. An electrical connecting structure, comprising:
a conductive pad disposed on a substrate;
a polymer bump disposed on the substrate; and
a patterned conductive layer disposed on the polymer bump and electrically connected with the conductive pad, wherein the patterned conductive layer covers a portion of the polymer bump and exposes another portion of the polymer bump,
wherein the polymer bump has an upper surface and a plurality of side surfaces, and the corner edges of the patterned conductive layer between neighboring side surfaces are exposed.

2. The electrical connecting structure of claim 1, wherein the patterned conductive layer comprises at least a strip pattern which extends from one of the side surfaces of the polymer bump to the opposite side surface through the upper surface.

3. The electrical connecting structure of claim 1, wherein the patterned conductive layer comprises at least a first strip pattern and at least a second strip pattern, which respectively extend from two of the side surfaces of the polymer bump to the opposite side surfaces through the upper surface, and the first strip pattern and the second strip pattern intersect on the upper surface.

4. The electrical connecting structure of claim 1, wherein the patterned conductive layer comprises a plurality of block patterns, each block pattern covers one of the side surfaces and extends to the upper surface, and exposes the corner edges.

5. The electrical connecting structure of claim 1, wherein the polymer bump is disposed on the substrate to cover the conductive pad or disposed on the substrate to expose the conductive pad.

6. The electrical connecting structure of claim 1, further comprising a protective layer disposed on the substrate and exposing the conductive pad.

7. The electrical connecting structure of claim 1, wherein the polymer bump is a polygonal column structure or a polygonal taper structure.

8. The electrical connecting structure of claim 1, wherein the polymer bump comprises at least one polymer material.

9. The electrical connecting structure of claim 1, wherein the polymer bump is a single-layer structure or a multi-layer structure.

10. The electrical connecting structure of claim 1, wherein the conductive layer comprises at least one conductive material.

11. The electrical connecting structure of claim 1, wherein the conductive layer is a single-layer structure or a multi-layer structure.

12. A bonding structure, comprising:
a first substrate, on which at least an electrical connecting structure is disposed, the electrical connecting structure comprising:
a conductive pad;
a polymer bump;
a patterned conductive layer disposed on the polymer bump and electrically connected with the conductive pad, wherein the patterned conductive layer covers a portion of the polymer bump and exposes another portion of the polymer bump; and
a second substrate, on which at least a conductive structure is disposed; and
a bonding layer disposed between the first substrate and the second substrate, wherein the polymer bump and the patterned conductive layer on the first substrate pass through the bonding layer to electrically connect with the conductive structure on the second substrate.

13. The bonding structure of claim 12, wherein the polymer bump of the electrical connecting structure has an upper surface and a plurality of side surfaces, a corner edge is between neighboring side surfaces, and the conductive layer exposes the corner edges.

14. The bonding structure of claim 13, wherein the patterned conductive layer of the electrical connecting structure comprises at least a strip pattern which extends from one of the side surfaces of the polymer bump to the opposite side surface through the upper surface.

15. The bonding structure of claim 13, wherein the patterned conductive layer of the electrical connecting structure comprises at least a first strip pattern and at least a second strip pattern, which respectively extend from two of the side surfaces of the polymer bump to the opposite side surfaces through the upper surface, and the first strip pattern and the second strip pattern intersect on the upper surface.

16. The bonding structure of claim 13, wherein the patterned conductive layer of the electrical connecting structure comprises a plurality of block patterns, wherein each block pattern covers one of the side surfaces and extends to the upper surface, and exposes the corner edges.

17. The bonding structure of claim 12, wherein the bonding layer comprises a non-conductive adhesive paste or a non-conductive adhesive film.

18. The bonding structure of claim 12, wherein the bonding layer further comprises filling particles distributed therein.

19. The bonding structure of claim 18, wherein the filling particles are electrically insulating or conductive.

* * * * *